US008428662B2

(12) United States Patent
Palmer et al.

(10) Patent No.: US 8,428,662 B2
(45) Date of Patent: Apr. 23, 2013

(54) HAND HELD MOBILE DEVICE CONTAINING COMFORT PERCHES

(75) Inventors: Mark Palmer, Bay Shore, NY (US); Chad Chaumont, Coram, NY (US)

(73) Assignee: Symbol Technologies, Inc., Holtsville, NY (US)

(*) Notice: Subject to any disclaimer, the term of this patent is extended or adjusted under 35 U.S.C. 154(b) by 289 days.

(21) Appl. No.: 12/697,329

(22) Filed: Feb. 1, 2010

(65) Prior Publication Data
US 2011/0188175 A1  Aug. 4, 2011

(51) Int. Cl.
*H04M 1/00* (2006.01)

(52) U.S. Cl.
USPC ............... 455/575.1; 455/575.8; 348/376

(58) Field of Classification Search ............... 455/575.1; 379/313, 13
See application file for complete search history.

(56) References Cited

U.S. PATENT DOCUMENTS

| 6,164,853 A * | 12/2000 | Foote ........................... 400/489 |
| 6,820,812 B2 * | 11/2004 | Bhatia et al. ............. 235/472.01 |
| 7,775,438 B2 * | 8/2010 | Beckhusen et al. ...... 235/472.01 |
| 2008/0100583 A1 | 5/2008 | Chaumont et al. |

* cited by examiner

*Primary Examiner* — Patrick Edouard
*Assistant Examiner* — Julio Perez

(57) ABSTRACT

The present disclosure provides methods and systems for a hand held mobile device that has a front surface, two side surfaces, and a bottom surface wherein the bottom surface partially includes a battery pack having an outer surface that forms an integral relationship with the bottom surface. The first perch and second perch at least partially extend away from the outer surface of the battery pack of the hand held mobile device. The first perch and the second perch are in a spaced-apart arrangement for allowing the finger of a user to be positioned between the first perch and the second perch during use of the hand held mobile device.

14 Claims, 7 Drawing Sheets

HAND HELD MOBILE DEVICE CONTAINING COMFORT PERCHES

FIELD OF THE INVENTION

The present invention relates generally to hand held mobile devices. More specifically, the present invention relates to at least two perches that fit the contours of a user's finger while the user is carrying and operating a hand held mobile device.

BACKGROUND OF THE INVENTION

Conventional hand held mobile devices take many shapes and sizes. Such conventional hand held mobile devices may be cumbersome, bulky, and heavy. Further, such hand held devices may create discomfort for the user after long periods of use. The user of conventional hand held mobile devices grips the outer surface while carrying the device and using the device. The traditional "box shape" or "brick shape" of these hand held mobile devices is not ergonomically designed to create comfort for the user or provide secure retention of the device. Because of the design of conventional hand held devices, a user experiences great discomfort during use. Additionally, the user is more apt to accidently drop a device, potentially causing damage to the device. Thus, what is still needed in the art is a hand held mobile device that allows user to comfortably and securely hold the hand held mobile device.

BRIEF SUMMARY OF THE INVENTION

In one exemplary embodiment, a hand held mobile device has a front surface, two side surfaces, and a bottom surface that includes a first perch and a second perch, wherein the bottom surface partially includes a battery pack having an outer surface that forms an integral relationship with the bottom surface. The first perch and second perch at least partially extend away from the outer surface of the battery pack. The first perch and the second perch are in a spaced-apart arrangement for allowing the finger of a user to be positioned between the first perch and the second perch during use of the hand held mobile device. The hand held mobile device may include a first perch and a second perch that extend away from the outer surface of the battery pack in a contoured configuration. The first perch and the second perch may serve no operational function, and may further include a third perch at least partially extending away from the outer surface of the battery pack. The hand held mobile device may include at least two perches in addition to the first perch and the second perch. The first perch and a second perch may optionally be removable from the surface. The first perch may have an arcuate top portion, and two side portions. The arcuate top portion may substantially extend the width of the bottom surface of the device having an apex near the center line of the bottom surface of the device and extending downwardly therefrom. The side portions of the first perch may be in a spaced-apart relationship and the distance between the side portions decreases as the first perch extends away from the bottom surface. The second perch may have a top portion and a concave side portion.

In yet another exemplary embodiment, the hand held mobile device includes a housing having a front surface, two side surfaces, and a bottom surface, wherein the bottom surface partially includes a battery pack having an outer surface that forms an integral relationship with the bottom surface. The housing is designed to be gripped by the fingers of a user. At least two, spaced apart perches are positioned on the outer surface of the battery pack and at least partially extending away from the outer surface of the batter pack. The at least two perches may provide a frictional surface for engaging the fingers of a user.

In yet another exemplary embodiment, a method for comfortably and securely retaining a hand held mobile device in the hand of a user includes providing a hand held mobile device having a front surface with a top portion and a bottom portion, two side surfaces, and a bottom surface wherein the bottom surface partially includes a battery pack having an outer surface that forms an integral relationship with the bottom surface, and a first perch and a second perch disposed on the outer surface of the battery pack of the hand held mobile device; positioning the index finger of a user between the first perch and the second perch and the thumb of a user on the front surface of the hand held mobile device for operating the hand held mobile device; engaging the index finger of the user to the first perch while the thumb of the user is operating the bottom portion of the hand held mobile device; and engaging the index finger of the user to the second perch while the thumb of the user is operating the top portion of the hand held mobile device. The method may further include providing a first perch that has an arcuate top portion, and two side portions. The arcuate top portion may substantially extend the width of the bottom surface of the device having an apex near the center line of the bottom surface of the device and extending downwardly therefrom. The side portions of the first perch may be in a spaced-apart relationship and the distance between the side portions decreases as the first perch extends away from the bottom surface. The method may also include providing a first perch and a second perch that are removable.

BRIEF DESCRIPTION OF THE DRAWINGS

The present invention is illustrated and described herein with reference to the various drawings of exemplary embodiments, in which like reference numbers denote like system components, respectively, and in which.

DETAILED DESCRIPTION OF THE INVENTION

Figure 1:
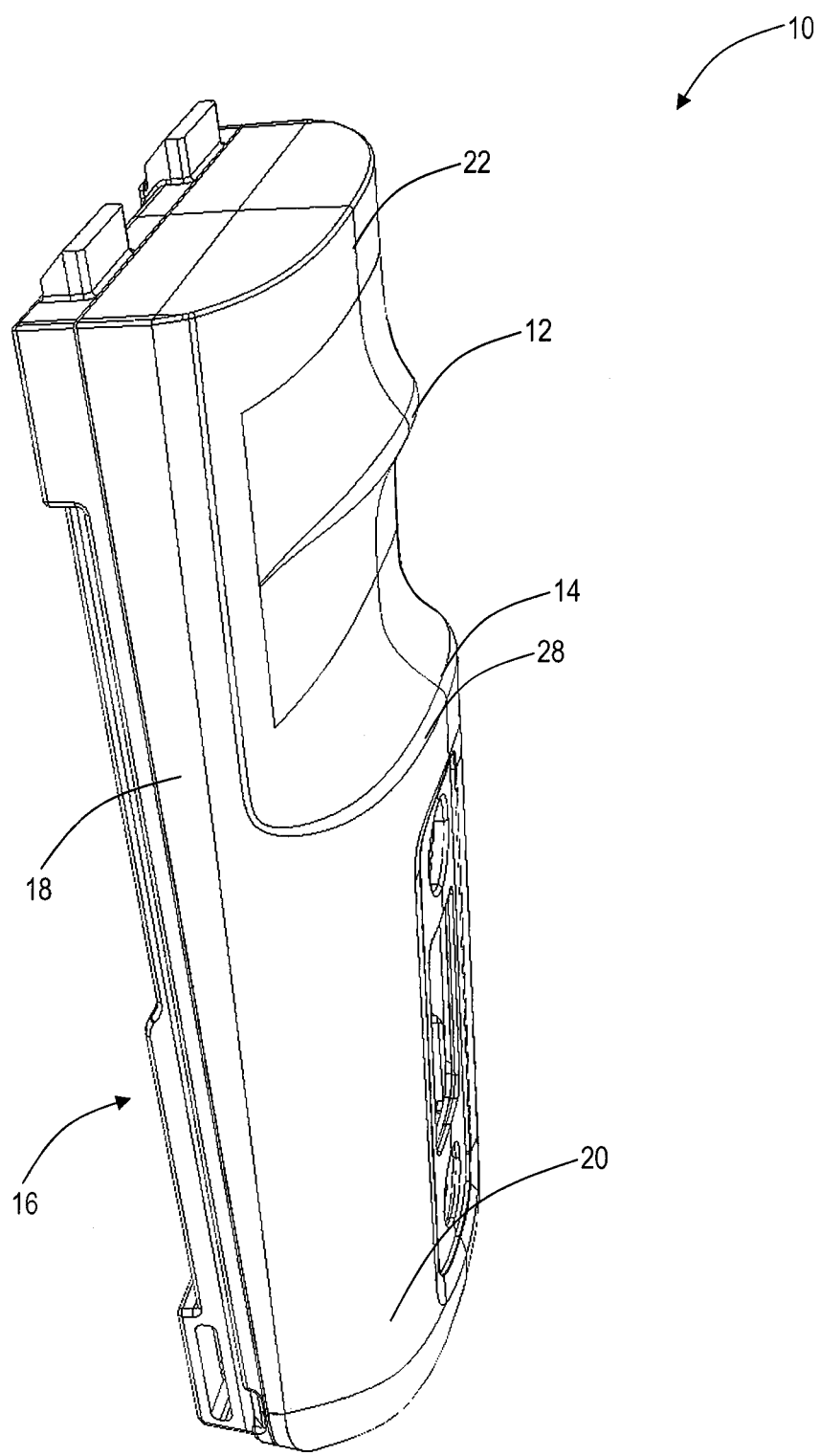
FIG. 1 is a back perspective view of an exemplary embodiment of the hand held mobile device with a first perch and a second perch.
Figure 2:
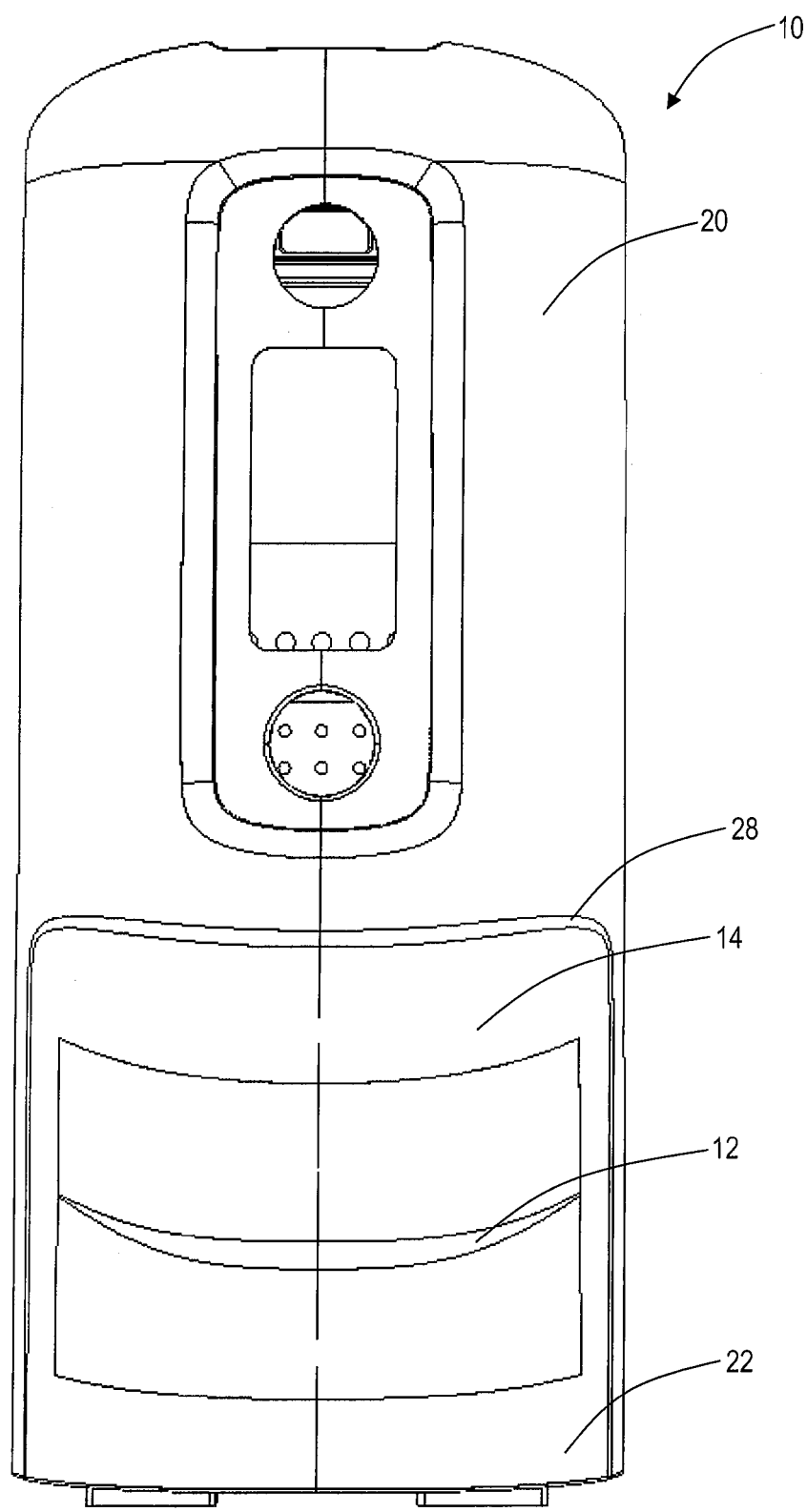
FIG. 2 is a top view of an exemplary hand held mobile device illustrating an exemplary shape of the first perch and second perch.
Figure 3:
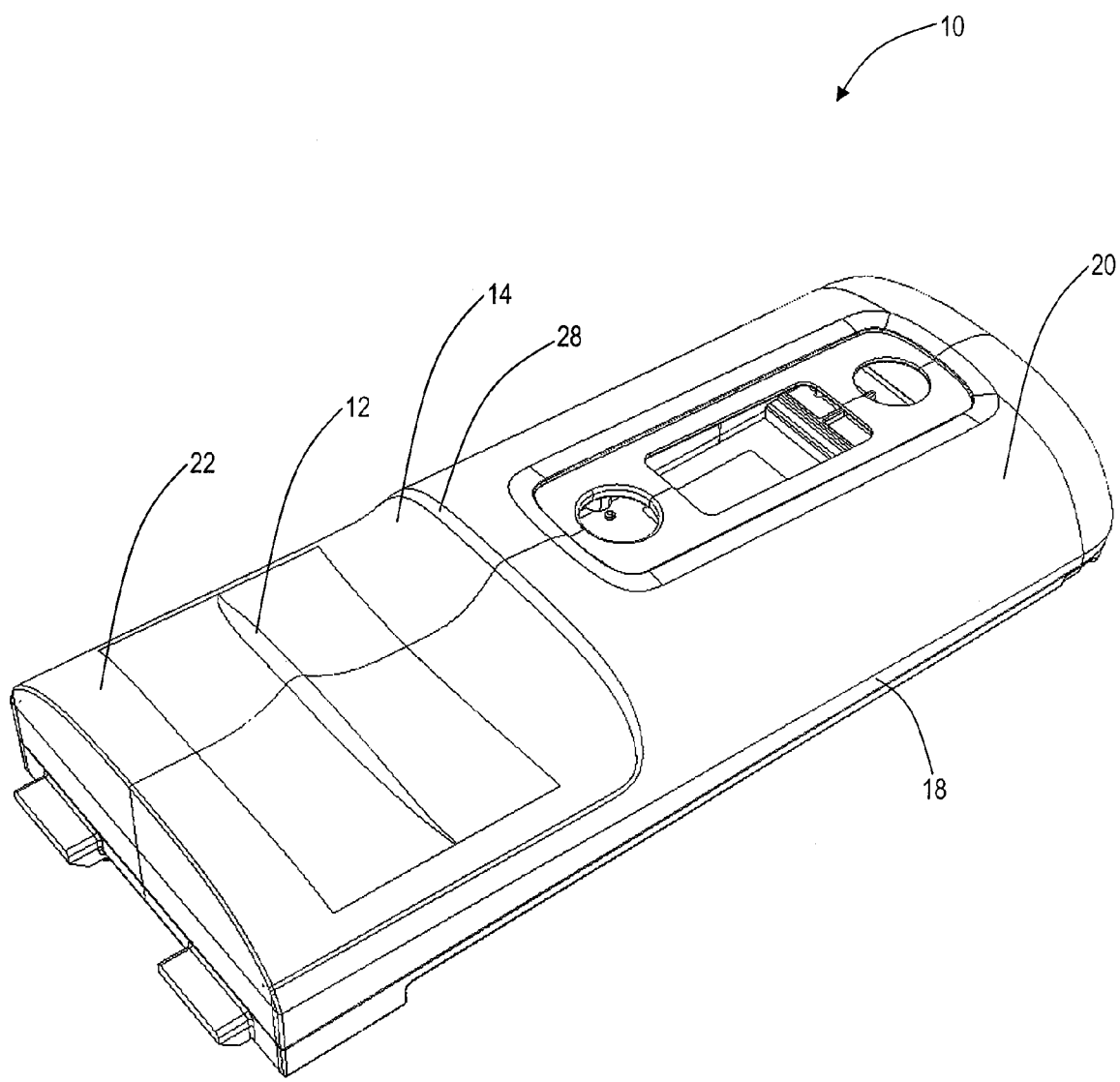
FIG. 3 is another perspective view of an exemplary embodiment of the hand held mobile device with a first perch and a second perch.
Figure 4:
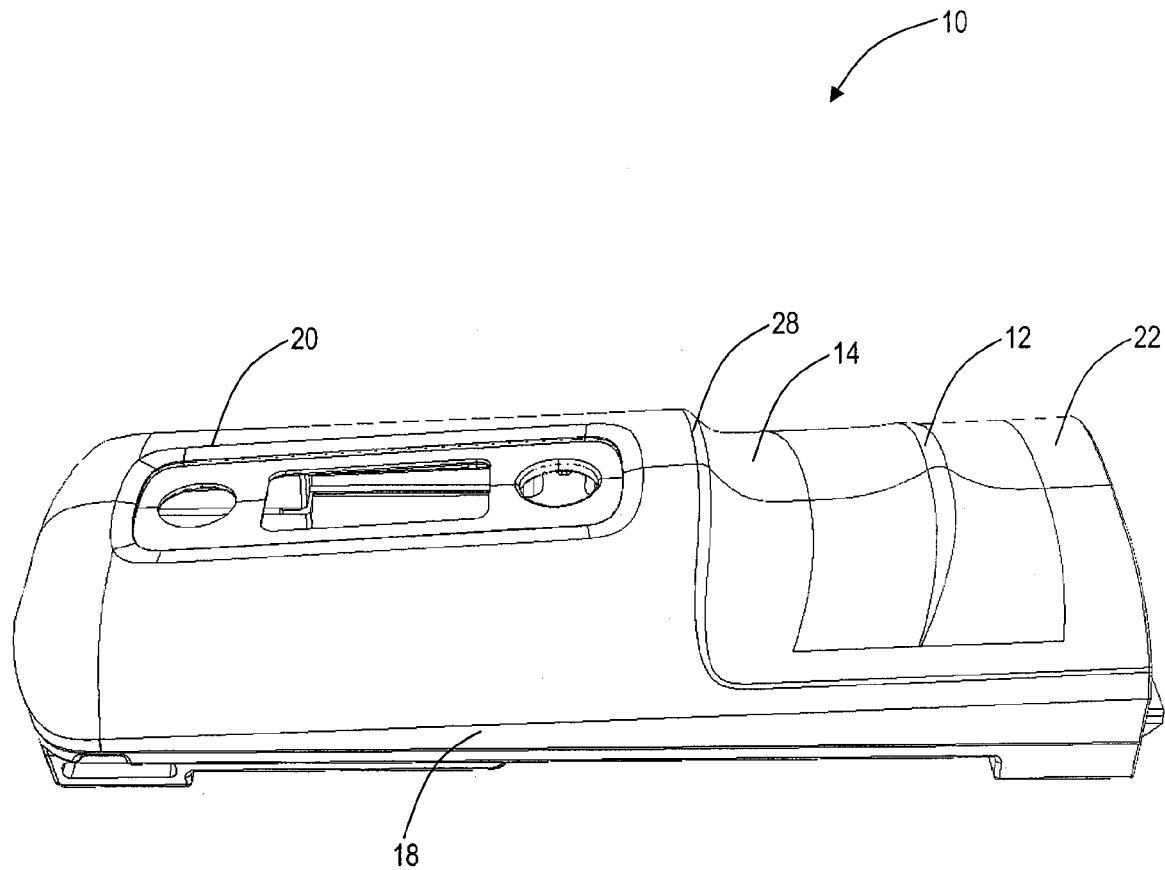
FIG. 4 is another perspective view of an exemplary embodiment of the hand held mobile device with a first perch and a second perch.
Figure 5:
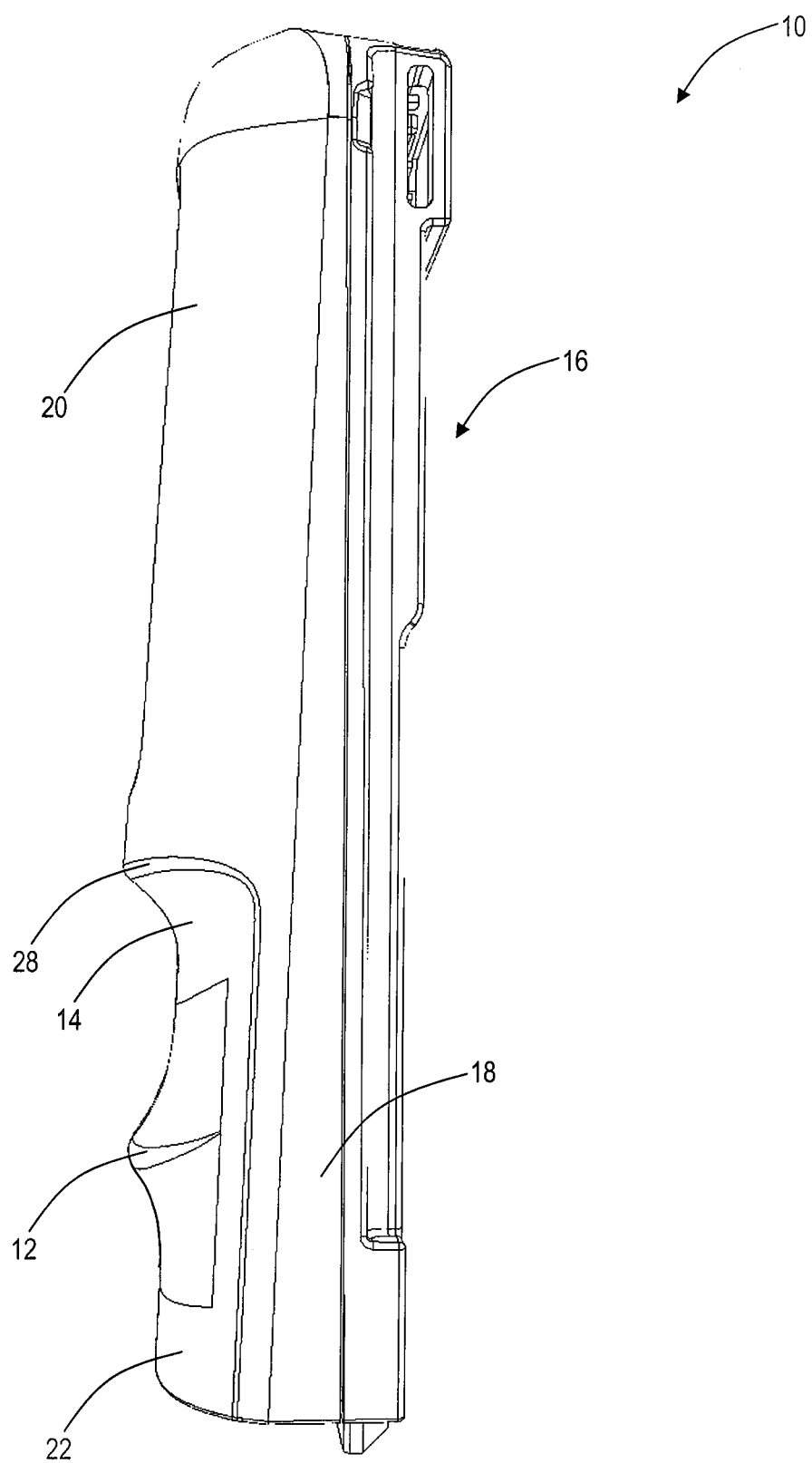
FIG. 5 is a side view of an exemplary embodiment of the hand held mobile device with a first perch and a second perch.
Figure 6:
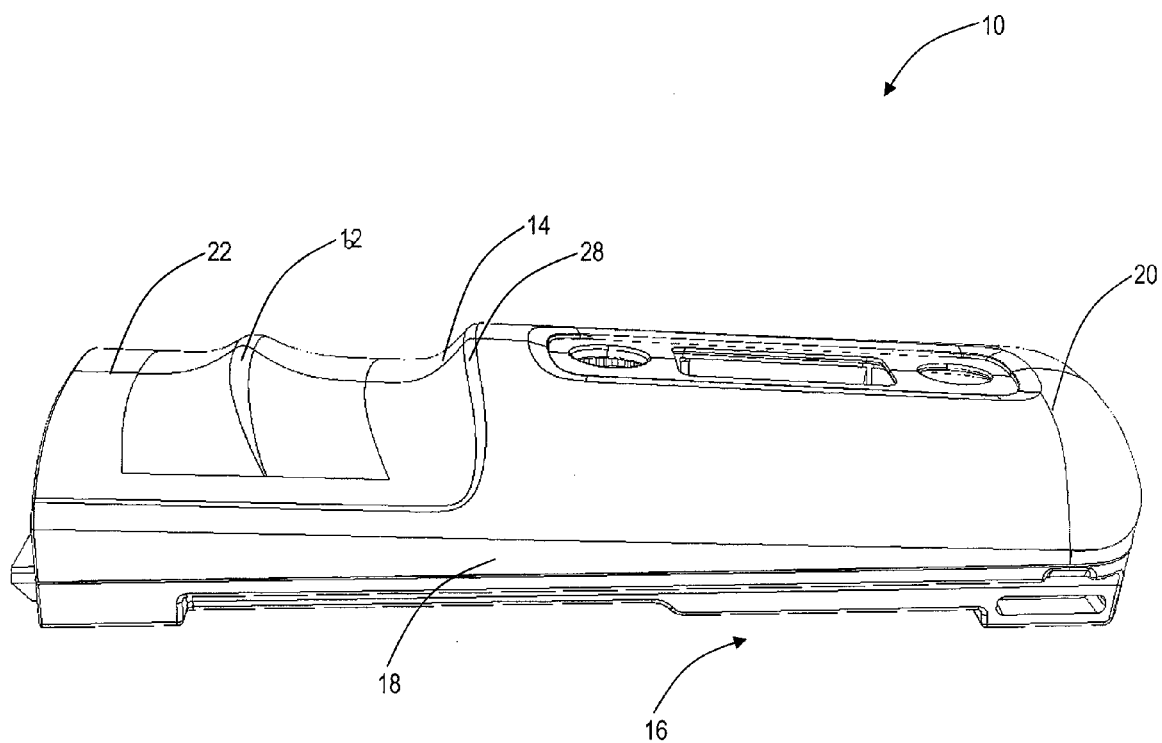
FIG. 6 is another perspective view of an exemplary embodiment of the hand held mobile device with a first perch and a second perch.
Figure 7:
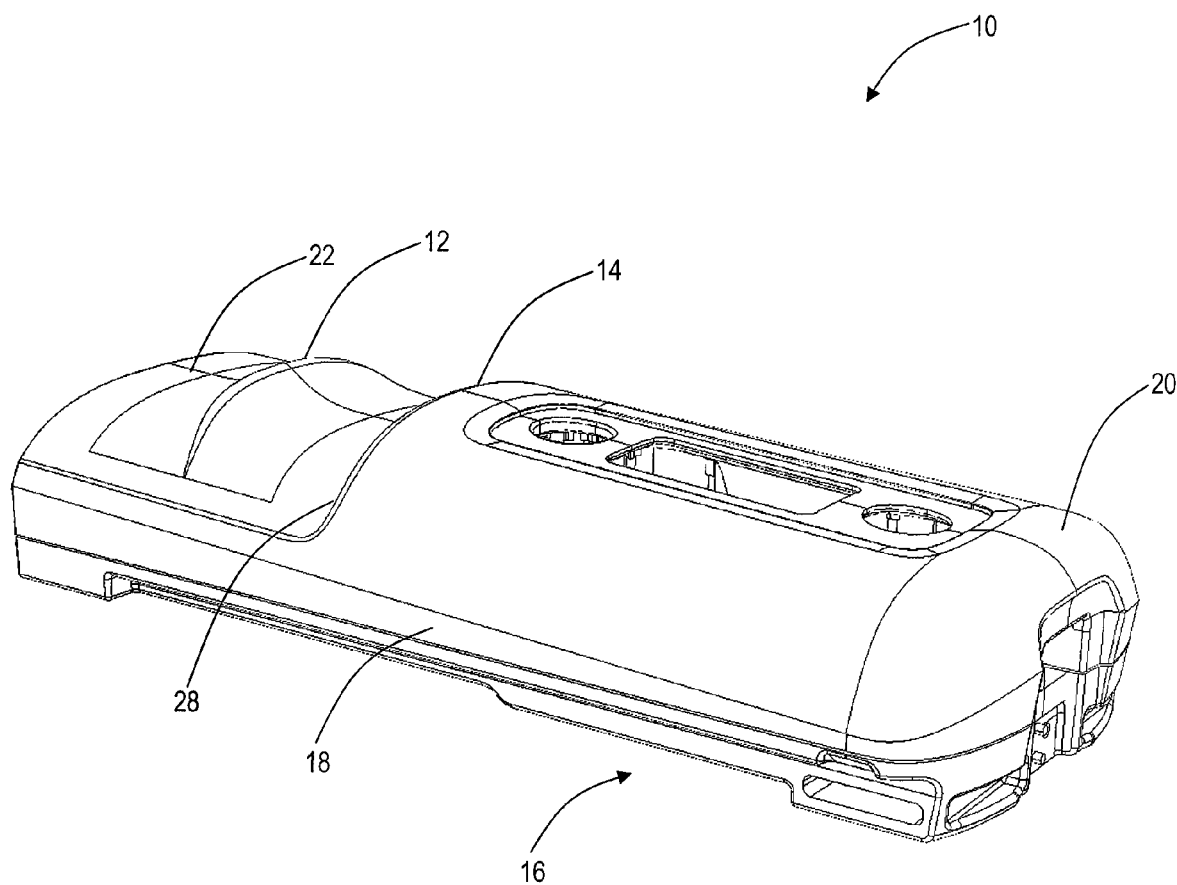
FIG. 7 is another perspective view of an exemplary embodiment of the hand held mobile device with a first perch and a second perch.

The present invention generally provides at least two perches disposed on or formed in an exterior surface of a hand held mobile device thereby allowing a user to comfortably and securely hold the hand held mobile device. The hand held mobile device may include, but is not limited to a radio frequency identification (RFID) reader, bar code scanner, mobile phone, digital music player, or the like. More specifically, the present invention may provide two perches disposed on an exterior surface that are contoured to the fingers of a user for allowing a user to comfortably and securely hold the hand held mobile device. It will be readily apparent to those of ordinary skill in the art that the perches may be disposed on any type of device (electric or non-electric), and any and all exemplary devices illustrated and described herein are intended to be non-limiting.

Referring now specifically to the drawings, an exemplary hand held mobile device is illustrated in FIGS. 1-7 and is shown generally at reference numeral 10. The device 10 as illustrated includes a first perch 12 and second perch 14 disposed on the exterior surface of the device 10. As illustrated, the exterior surface of the device 10 has four surfaces, including a top surface 16, two side surfaces 18, and a bottom surface 20. However, any suitable number of sides may be used. The outer surface of a battery pack 22 may be integrally formed within the bottom surface 20.

As illustrated in FIG. 1, the first perch 12 is integrally formed within the outer surface of the battery pack 22 of the device 10 and at least partially extends away from the outer surface of the battery pack 22 of the device 10. Specifically, the first perch 12 is integrally formed within the battery pack 22 that forms an integral relationship with the bottom surface 20 of the device 10. The first perch 12 may have a frustoconical shape. Additionally, the first perch 12 may be contoured from either side or both sides of the center point of the first perch 12 for conforming with the natural curvature the finger of a user.

It will be understood by one of ordinary skill in the art that the first perch 12 may have any type of structure and/or shape and any and all exemplary structures and/or shapes illustrated and described herein are intended to be non-limiting but exemplary. As illustrated in the present embodiment, the first perch 12 has a top portion 24 that substantially extends the width of the bottom surface 20 of the device 10. The first perch 12 has an arcuate top portion 24 that has an apex near the center line of the bottom portion 20 of the device 10 and extends downward. The side portions 26 of the first perch 12 are in a spaced-apart relationship and the distance between the side portions 26 decreases as the first perch 12 extends away from the bottom surface 20 of the device 10.

As illustrated in FIG. 1, the second perch 14 is integrally formed within the outer surface of the battery pack 22 of the device 10 and at least partially extends away from the battery pack 22 of the device 10. Specifically, the second perch 14 is integrally formed within the outer surface of the battery pack 22. The second perch 14 performs as the upper lip of the outer surface of the battery pack 22. In other words, the top portion 28 of the second perch 14 engages the static portion of the bottom surface 20 when the battery pack 22 is inserted into the device 10.

It will be understood by one or ordinary skill in the art that the second perch 14 may have any type of structure and/or shape and any and all exemplary structures and/or shapes illustrated and described herein are intended to be non-limiting but exemplary. As illustrated in the present embodiment, the second perch 14 has a top portion 28 and a concave side portion. In another exemplary embodiment, the second perch 14 has a top portion 28 that substantially extends the width of the bottom surface 20 of the device 10. The second perch 14 has an arcuate top portion 28 that has an apex near the center line bottom portion 20 of the device 10 and extends downward. The second perch 14 may also include two side portions. The side portions of the second perch 14 are in a spaced-apart relationship and the distance between the side portions decreases as the second perch 14 extends away from the bottom surface 20 of the device 10.

During use, the hand held mobile device 10 is ideally cupped within the palm of the user's hand. The index finger of the user is positioned in the space between the first perch 12 and the second perch 14. The remaining fingers grip the hand held mobile device 10 below the first perch 12. The thumb is utilized to operate the controls that are most likely located on the top surface 16 of the device 10. By way of example only, many hand held mobile devices will have a keypad or the like on the bottom half of the top surface 16 and a display screen on the top half of the top surface 16. As the user is typing on the key pad with their thumb, the index finger is braced against the first perch 12 stabilizing the device. As the user begins using the buttons associated with the display screen, the index finger migrates across the space between the first perch 12 and second perch 14, resulting in the index finger being braced against the second perch 14. In other words, as the user is using the lower portion of the device 10, the index finger is braced against the first perch 12. When the user is utilizing the upper portion of the device 10, the index finger is braced against the second perch 14. The arrangement and shape of the first perch 12 and second perch 14 are designed to allow the user to easily and comfortably transition between the perches (12, 14), increasing the comfort to the user and retainage of the device by the user.

As illustrated herein, the first perch 12 and second perch 14 are made of plastic and molded onto the external surface of the battery pack 22. In another exemplary embodiment, the perches (12, 14) may include rubber molded over a plastic portion. In yet another exemplary embodiment, the perches (12, 14) may be molded directly to the bottom surface 20. In yet another exemplary embodiment, the perches (12, 14) may be composed solely of rubber and engaged to the bottom surface 20 of the device 10 or the battery pack 24. In yet another exemplary embodiment, the perches (12, 14) may be engaged to the device 10 using a high bond adhesive. In yet another exemplary embodiment, the perches (12, 14) are removable.

The perches (12, 14) may be placed in close proximity to the center of gravity of the device 10. Placing the perches (12, 14) near the center of gravity allows the device 10 to balance upon the index finger of the user, creating a comfortable grip. However, the perches (12, 14) may be placed at any location of the bottom surface 20 of the device 10.

In an exemplary embodiment, the space between the first perch 12 and second perch 14 is about an inch. The inch spacing would be slightly larger than the average width of an adult's index finger. However, any amount of space between the first perch 12 and second perch 14 will suffice.

As illustrated in FIGS. 1-7, the device 10 includes a first perch 12 and a second perch 14. However, in another exemplary embodiment, the device 10 may contain a plurality of perches. It will be readily apparent to those of ordinary skill in the art that any number of perches may be disposed on the outer surface of the battery pack 22, and any and all exemplary devices illustrated and described herein are intended to be non-limiting.

The perches (12, 14) of the present invention are non-operational, meaning the perches (12, 14) do not operate the hand held mobile device 10. The sole purpose of the perches (12, 14) is to allow a user to comfortably and securely hold a hand held mobile device 10. The perches (12, 14) are not coupled to any electrical components for receiving data input from the hand held device 10. The perches (12, 14) serve solely a static, stationary function of allowing a user to comfortably and securely hold a hand held mobile device 10.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A hand held mobile device having a front surface, two side surfaces, and a bottom surface wherein the bottom surface partially includes a battery pack having an outer surface that forms an integral relationship with the bottom surface, comprising a first perch and a second perch at least partially extending away from the battery pack and positioned proximate to a center of gravity of the device, the first perch and the second perch are in a spaced-apart arrangement for allowing a finger of a user to be positioned between the first perch and the second perch, wherein the first perch comprises an arcuate top portion and two side portions, the arcuate top portion substantially extending the width of the bottom surface of the device and having an apex near the center line of the bottom surface of the device and extending downwardly therefrom, the side portions of the first perch being in a spaced-apart relationship and the distance between the side portions decreasing as the first perch extends away from the bottom surface.

2. The hand held mobile device of claim 1, wherein the first perch and the second perch are contoured from the center point of the first perch for receiving and conforming with the natural curvature of the finger of a user.

3. The hand held mobile device of claim 1, wherein the first perch and the second serve no operational function.

4. The hand held mobile device of claim 1, further comprising a third perch at least partially extending away from the battery pack.

5. The hand held mobile device of claim 1, further comprising at least two perches in addition to the first perch and the second perch.

6. The hand held mobile device of claim 1, wherein the first perch and the second perch are removable.

7. The hand held mobile device of claim 1, wherein the second perch that has a top portion and a concave side portion.

8. A hand held mobile device; comprising
a housing having a front surface, two side surfaces, and a bottom surface, wherein the bottom surface partially includes a battery pack having an outer surface that forms an integral relationship with the bottom surface,
at least two, spaced apart perches positioned on the battery pack proximate to a center of gravity of the device and at least partially extending away from the battery pack, wherein the at least two perches provide a frictional surface for engaging the fingers of a user and allowing a user to comfortably hold the hand held mobile device, wherein a first perch of the at least two, spaced apart perches comprises an arcuate top portion and two side portions, the arcuate top portion substantially extending the width of the bottom surface of the housing and having an apex near the center line of the bottom surface of the housing and extending downwardly therefrom, the side portions of the first perch being in a spaced-apart relationship and the distance between the side portions decreasing as the first perch extends away from the bottom surface.

9. The hand held mobile device of claim 8, wherein the at least two perches are contoured from the center point of the first perch for receiving and conforming with the natural curvature of the finger of a user.

10. The hand held mobile device of claim 8, wherein the at least two perches serve no operational function.

11. The hand held mobile device of claim 8, wherein the at least two perches are removable.

12. The hand held mobile device of claim 8, wherein the second perch has a top portion and a concave side portion.

13. A method for comfortably and securely retaining a hand held mobile device in the hand of a user, comprising:
providing a hand held mobile device having a front surface with a top portion and a bottom portion, two side surfaces, and a bottom surface, wherein the bottom surface partially includes a battery pack having an outer surface that forms an integral relationship with the bottom surface, and a first perch and a second perch disposed on the outer surface of the battery pack proximate to a center of gravity of the hand held mobile device, wherein the first perch comprises an arcuate top portion and two side portions, the arcuate top portion substantially extending the width of the bottom surface of the device and having an apex near the center line of the bottom surface of the device and extending downwardly therefrom, the side portions of the first perch being in a spaced-apart relationship and the distance between the side portions decreasing as the first perch extends away from the bottom surface;
positioning the index finger of a user between the first perch and the second perch and the thumb of a user on the front surface of the hand held mobile device for operating the hand held mobile device;
engaging the index finger of the user to the first perch while the thumb of the user is operating the bottom portion of the hand held mobile device; and
repositioning the index finger of the user to the second perch while the thumb of the user is operating the top portion of the hand held mobile device.

14. The method of claim 13, further comprising:
providing a first perch and a second perch that are removable.

* * * * *